United States Patent
Mangrum et al.

(10) Patent No.: US 9,153,543 B1
(45) Date of Patent: Oct. 6, 2015

(54) SHIELDING TECHNIQUE FOR SEMICONDUCTOR PACKAGE INCLUDING METAL LID AND METALIZED CONTACT AREA

(75) Inventors: Marc Alan Mangrum, Manchaca, TX (US); Anthony Panczak, Phoenix, AZ (US)

(73) Assignee: Amkor Technology, Inc., Tempe, AZ (US)

( * ) Notice: Subject to any disclaimer, the term of this patent is extended or adjusted under 35 U.S.C. 154(b) by 278 days.

(21) Appl. No.: 13/356,330

(22) Filed: Jan. 23, 2012

(51) Int. Cl.
*H01L 23/60* (2006.01)
*H01L 23/06* (2006.01)

(52) U.S. Cl.
CPC ............... *H01L 23/60* (2013.01); *H01L 23/06* (2013.01); *H01L 2225/06537* (2013.01); *H01L 2924/3025* (2013.01)

(58) Field of Classification Search
CPC ............ H01L 23/5225; H01L 2924/3025; H01L 23/60; H01L 23/06
USPC .................................................. 257/670, 666
See application file for complete search history.

(56) References Cited

U.S. PATENT DOCUMENTS

| | | | | |
|---|---|---|---|---|
| 5,043,534 A | * | 8/1991 | Mahulikar et al. ............ | 174/359 |
| 6,222,259 B1 | | 4/2001 | Park | |
| 6,853,055 B1 | * | 2/2005 | Kuang ........................... | 257/659 |
| 7,030,469 B2 | * | 4/2006 | Mahadevan et al. .......... | 257/659 |
| 7,381,049 B2 | | 6/2008 | Li et al. | |
| 7,381,589 B2 | | 6/2008 | Minervini | |
| 7,434,305 B2 | | 10/2008 | Minervini | |
| 7,439,616 B2 | | 10/2008 | Minervini | |
| 7,501,703 B2 | | 3/2009 | Minervini | |
| 7,537,964 B2 | | 5/2009 | Minervini | |
| 7,892,889 B2 | | 2/2011 | Howard | |
| 7,898,066 B1 | | 3/2011 | Scanlan | |
| 8,012,868 B1 | | 9/2011 | Naval | |
| 8,018,049 B2 | | 9/2011 | Minervini | |
| 8,269,320 B2 | * | 9/2012 | Huang et al. .................. | 257/660 |
| 2004/0184632 A1 | | 9/2004 | Minervini | |
| 2007/0082421 A1 | | 4/2007 | Minervini | |
| 2007/0201715 A1 | | 8/2007 | Minervini | |
| 2007/0215962 A1 | | 9/2007 | Minervini | |
| 2008/0014678 A1 | * | 1/2008 | Howard et al. ............... | 438/106 |
| 2008/0310114 A1 | * | 12/2008 | Pawlenko et al. ............. | 361/704 |
| 2012/0181676 A1 | * | 7/2012 | Tsui et al. ...................... | 257/675 |
| 2012/0218729 A1 | * | 8/2012 | Carey et al. ................... | 361/807 |

* cited by examiner

*Primary Examiner* — Ermias Woldegeorgis
*Assistant Examiner* — Benjamin Tzu-Hung Liu
(74) *Attorney, Agent, or Firm* — Kevin B. Jackson

(57) ABSTRACT

In one embodiment a semiconductor package includes a metal lid configured as a shield that effectively surrounds the active circuitry, and thus forms a type of Faraday shield. The lid is electrically coupled to a metalized area located on the surface of the active circuitry, or to an additional metalized die. Appropriate interconnect methods between the lid and the metalized die or metalized area include, but are not restricted to, wire bonding, bumps, tabs, or similar techniques.

20 Claims, 2 Drawing Sheets

SHIELDING TECHNIQUE FOR SEMICONDUCTOR PACKAGE INCLUDING METAL LID AND METALIZED CONTACT AREA

CROSS-REFERENCE TO RELATED APPLICATIONS

Not Applicable

STATEMENT RE: FEDERALLY SPONSORED RESEARCH/DEVELOPMENT

Not Applicable

BACKGROUND OF THE INVENTION

1. Field of the Invention

The present invention relates generally to semiconductor devices and, more particularly, to a semiconductor package which includes a metal lid coupled to one or more prescribed metal features of the leadframe of the package to form a shield that effectively surrounds the active circuitry, thus creating a type of Faraday shield.

2. Description of the Related Art

Semiconductor dies are conventionally enclosed in plastic packages that provide protection from hostile environments and enable electrical interconnection between the semiconductor die and an underlying substrate such as a printed circuit board (PCB) or motherboard. The elements of such a package comprise a metal leadframe, an integrated circuit or semiconductor die, bonding material to attach the semiconductor die to the leadframe, bond wires which electrically connect pads or contacts on the semiconductor die to individual leads of the leadframe, and a hard plastic encapsulant material which covers the other components and forms the exterior of the semiconductor package, commonly referred to as the package body.

The leadframe is the central supporting structure of such a package, and is typically fabricated by chemically etching or mechanically stamping a metal strip. A portion of the leadframe is internal to the package, i.e., completely surrounded by the plastic encapsulant or package body. Portions of the leads of the leadframe may extend externally from the package body, or may be partially exposed therein for use in electrically connecting the semiconductor package to another, external component. In certain semiconductor packages, a portion of the die pad of the leadframe also remains exposed within the package body. Additionally, in other semiconductor package designs, the leadframe is substituted with a laminate substrate which includes conductive patterns adapted to facilitate the electrical connection thereof to both the semiconductor die and an external component. Still further, other semiconductor package designs such as cavity packages and hermetic packages often include a metal lid attached to other prescribed portions thereof, such as the package body of the package.

As the art has moved to smaller, lighter weight, and higher frequency electronic devices such as cellular telephones, semiconductor packages utilized in these electronic devices are increasingly placed closer to other electronic components and structures. Due to this reduced spacing, electromagnetic interference (EMI) or radio frequency (RF) radiation emanating from a semiconductor package has a greater probability of interfering with the normal operation of an adjacent electronic component, and vice-versa. In this regard, many applications using semiconductor packages that incorporate a metal lid (e.g., the cavity packages and hermetic packages described above) often also require a modality for shielding the active circuitry contained in the package from the effects of EMI and/or RF interference. As indicated above, in some applications, the shield is required to prevent the active circuitry contained within the package from emitting frequencies or "noise" that might affect the performance of the application or other components therein.

To prevent such unacceptable EMI and/or RF interference, it is known in the prior art to add one or more shields (often referred to as "cans" or "cages") to an application during the board level assembly process. These shields are typically attached to an underlying support structure such as a printed circuit board (PCB) to provide EMI/RF shielding to the electronic component(s) covered thereby. Though these shields are available in multiple designs and shapes, they are not always as effective as desired, and can further add as much as 15% to the overall manufacturing cost of the device depending upon the design and device performance specifications thereof. As a result, the inclusion of the shield(s) in the application typically adds cost, complexity, and support issues thereto. Still further, the efficacy of shielding cages is typically limited since such cages typically do not share an on-die or interior package reference ground. In this regard, establishing a common ground potential with a circuit device depends upon the PCB ground plane design and interconnect via technology utilized, as well as the solder joints of the package to the board.

Another technique employed in the prior art to prevent EMI and/or RF interference involves the use of conformal, conductive coatings. More particularly, in accordance with this technique, the entire package is coated with an impregnated conductive material such as Ag that is electrically connected to the ground reference of device. However, this technique does not work with MEMS devices or those requiring an external port or opening in the top or bottom of the package.

Yet another prior art technique to prevent unacceptable EMI and/or RF interference involves the application of a conformal shielding material to the package body of a semiconductor package, and establishing electrical communication between the shielding material and contact points on a prescribed surface of the package through the use of wires which extend through and protrude from the package body. However, this particular technique is limited to over-molded semiconductor packages and to those that have sufficient interior space to add those internal wires which facilitate the electrical communication with the shielding material. Moreover, such wires must be interstitially spaced around the perimeter of the semiconductor package well as between other components if included in the interior thereof.

Thus, in the case of molded semiconductor packages that incorporate a lid, there are no known shielding techniques currently applied beyond conformal coatings, or the can and cage techniques described above. The present invention addresses this issue by allowing for the use of the lid as a shield that effectively surrounds the active circuitry, and thus forms a type of Faraday shield. In accordance with the present invention, the lid is coupled to a metalized area located on the surface of the active circuitry, or to an additional metalized die. Appropriate interconnect methods between the lid and the metalized die or metalized area include, but are not restricted to, wire bonding, bumps, tabs, or similar techniques. As such, the present invention provides a unique approach to addressing EMI and/or RF interference in that it contemplates the utilization of a metalized area located on the surface of the die as a feature of the die, or as a redistribution layer (RDL) of a prescribed shape added to the die surface, or as a separate metalized die stacked on the surface of an active circuit or adjacent thereto. These, as well as other features and advantages of the present invention will be discussed in more detail below.

BRIEF DESCRIPTION OF THE DRAWINGS

These, as well as other features of the present invention, will become more apparent upon reference to the drawings wherein.

Common reference numerals are used throughout the drawings and detailed description to indicate like elements.

DETAILED DESCRIPTION OF THE INVENTION

Figure 1:
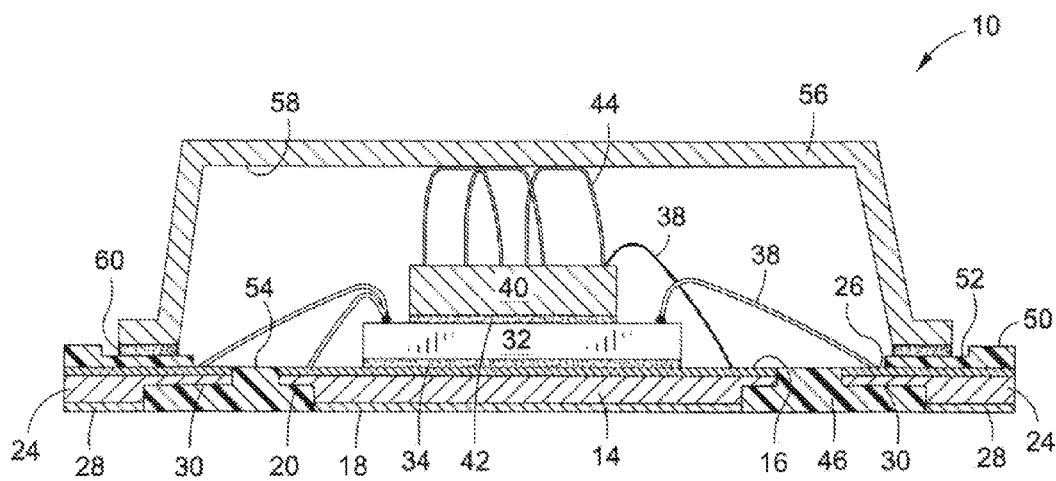
FIG. 1 is a cross-sectional view of a semiconductor package constructed in accordance with a first embodiment of the present invention.
Figure 2:
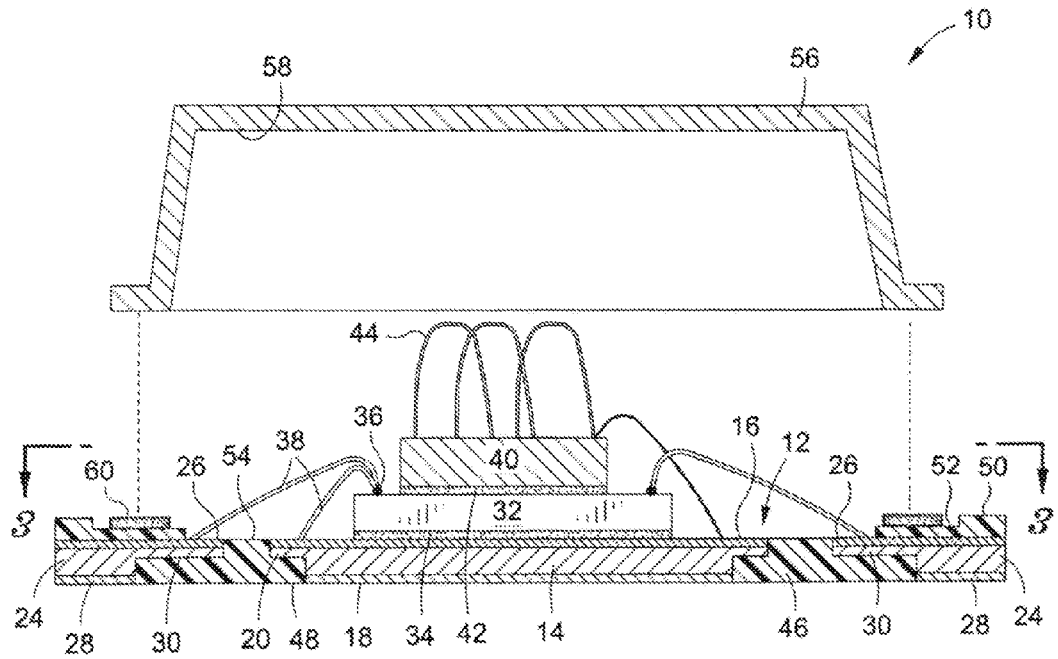
FIG. 2 is an exploded view of the semiconductor package shown in FIG. 1.
Figure 3:
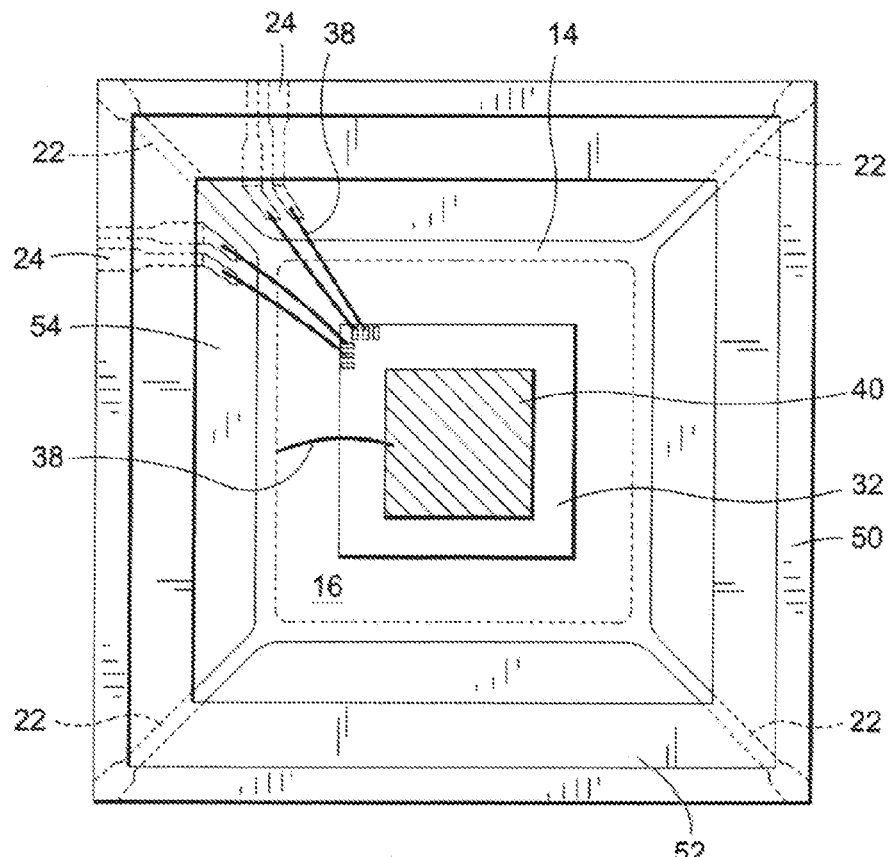
FIG. 3 is a top plan view of the semiconductor package shown in FIGS. 1 and 2 in a partially assembled state, prior to the attachment of the lid thereto through the use of a wire fence.

Referring now to the drawings wherein the showings are for purposes of illustrating preferred embodiments of the present invention only, and not for purposes of limiting the same, FIGS. 1-3 depict a semiconductor package 10 constructed in accordance with a first embodiment of the present invention. One of the structural features of the semiconductor package 10 is its leadframe 12. The leadframe 12 comprises a die paddle or die pad 14 which has a generally quadrangular (e.g., at least four sides and four angles) configuration, and defines four peripheral edge segments. The die pad 14 also defines a generally planar top surface 16, and an opposed, generally planar bottom surface 18. In the process of fabricating the leadframe 12, the die pad 14 is preferably subjected to a partial etching process which facilitates the formation of a recessed shoulder or shelf 20 therein. The shelf 20 substantially circumvents the bottom surface 18 of the die pad 14, and is disposed in opposed relation to the peripheral portion of the top surface 16 thereof. The depth of the shelf 20 is preferably about half of the total thickness of the die pad 14 (i.e., the distance separating the top and bottom surfaces 16, 18 from each other). The functionality of the shelf 20 will be discussed in more detail below.

The leadframe 12 also includes a plurality of tie bars 22 which are integrally connected to and extend diagonally from respective ones of the four corner regions defined by the die pad 14. Each of the tie bars 22 defines a generally planar top surface which extends in generally co-planar relation to the top surface 16 of the die pad 14. During the fabrication of the leadframe 12, each of the tie bars 22 is preferably subjected to a partial etching process which results in each of the tie bars 22 defining a bottom surface which extends in generally co-planar relation to the shelf 20.

In addition to the die pad 14 and tie bars 22, the leadframe 12 comprises a plurality of leads 24. Though only several exemplary leads 24 are shown in FIG. 3, in the leadframe 12, the leads 24 are preferably segregated into four sets, with each set of the leads 24 extending along and in spaced relation to a respective one of the peripheral edge segments defined by the die pad 14. As seen in FIGS. 1 and 2, each of the leads 24 defines a generally planar top surface 26 and an opposed, generally planar bottom surface 28. The top surface 26 extends in generally co-planar relation to the top surface 16 of the die pad 14, as well as the top surfaces of the tie bars 22. The bottom surface 28 of each lead 24 extends in generally co-planar relation to the bottom surface 18 of the die pad 14. Though the leads 24 may be formed to have any one of a multiplicity of differing shapes or configurations, in the exemplary embodiment shown in FIG. 3, each of the leads 24 is preferably formed to include an inner end portion which is angularly offset relative to the remainder thereof.

In fabricating the leadframe 12, each lead 24 is subjected to a partial etching process which results in the inner end portion thereof being of a reduced thickness as is shown with particularity in FIGS. 1 and 2. It is contemplated that the partial etching of each lead 24 will be completed such that the thickness of the inner end portion is approximately (but not limited to) one-half the total thickness of the lead 24 (i.e., the distance between the top and bottom surfaces 26, 28). Additionally, the partial or half-etching of the inner end portion of each lead 24 preferably occurs such that upon the completion of the etching process, each inner end portion defines a shelf 30 which is recessed relative to the bottom surface 28. In the leadframe 12, the shelf 30 of the inner end portion of each lead 24 extends in generally co-planar relation to the shelf 20 of the die pad 14 and the bottom surfaces of the tie bars 22.

In the semiconductor package 10 it is contemplated that the leadframe 12 will be fabricated from a copper-based material, a copper alloy-based material, steel, non-ferrous, or an alloy material such as Alloy 42 having suitable conductive metal plating layers applied thereto. As such, as is best seen in FIGS. 1 and 2, the top and bottom surfaces 16, 18 of the die pad 14, the top and bottom surfaces 26, 28 of each of the leads 24, and the top surface of each of the tie bars 22 are each actually defined by one of the plating layers applied to the underlying copper, copper alloy or Alloy 42 material.

In addition to the leadframe 12, the semiconductor package 10 comprises a first, lower semiconductor die 32 which is attached to the top surface 16 of the die pad 14. More particularly, the semiconductor die 32 defines opposed, generally planar top and bottom surfaces, with the bottom surface of the first semiconductor die 32 being attached to a central portion of the top surface 16 of the die pad 14 through the use of a layer 34 of a suitable adhesive, such as an epoxy or a die attach film. Disposed on a peripheral portion of the top surface of the first semiconductor die 32 is a plurality of conductive terminals 36, at least some of which are electrically connected to respective ones of the leads 24 through the use of conductive wires 38. It is contemplated that for those terminals 36 electrically connected to the leads 24, the corresponding wires 38 will extend between the terminals 36 and the top surfaces 26 of corresponding ones of the leads 24. As further shown in FIGS. 1 and 2, it is also contemplated that wires 38 may be used to facilitate the electrical connection of one or more of the terminals 36 to a peripheral portion of the top surface 16 of the die pad 14 to provide a grounding function.

The semiconductor package 10 further comprises a second, upper semiconductor die 40 which is attached to the top surface of the first semiconductor die 32. When viewed from the perspective shown in FIGS. 1-3, the length and width dimensions of the first semiconductor die 32 exceed those of the second semiconductor die 40. As a result, when the bottom surface of the second semiconductor die 40 is attached to a central area of the top surface of the first second semiconductor die 32 inward of the terminals 36 formed thereon, the outer peripheral surface of the second semiconductor die 40 is oriented inwardly relative to the outer peripheral surface of the first semiconductor die 32. The attachment of the bottom surface of the second semiconductor die 40 to the central portion of the top surface of the first semiconductor die 32 is preferably facilitated through the use of a layer 42 of a suitable adhesive, such as a conductive or non-conductive epoxy or a conductive or non-conductive die attach film. In addition to their differing relative sizes, the other primary distinction between the first and second semiconductor dies 32, 40 lies in the entirety of the top surface of the second semiconductor die 40, or at least a portion thereof, being metalized, and thus defining a metalized area. However, it is contemplated that the peripheral outer surface of the second semiconductor die 40 may also be metalized along with the top surface thereof. In the semiconductor package 10, the size of the stacked, metalized second semiconductor die 40 is selected using standard stacked die design rules, and is sized appropriate to the active wire bond positions and the die size of the underlying, active first semiconductor die 32. Along these lines, it is contemplated that the second semiconductor die 40 will be sized to facilitate the maximum coverage of the top surface of the first semiconductor die 32 without interfering with the terminals 36, and that the thickness of the second semiconductor die 40 may vary, and be determined by availability, stack height limitations, and assembly process handling capability. The metallization formed on the second semiconductor die 40 may be Al, NiAu, NiPdAu, Cu, Au, Ag, Sn, or any other appropriate material used in the construction of IC packages and in IC wafer fabrication.

As shown in FIGS. 1 and 2, one or more wires 38 may be extended between and electrically connected to the metalized top surface of the second die 40 and the peripheral portion of the top surface 16 of the die pad 14 to provide a grounding function. As further seen in FIGS. 1 and 2, in the semiconductor package 10, a wire bonding process is used to facilitate the formation of a net, loom or mesh of wire 44 on the metalized top surface of the second semiconductor die 40. The wires 44 are of a conductive material such as that used for wires 38, may be provided in any number, and are of a prescribed loop height for reasons which will be discussed in more detail below.

In the semiconductor package 10, portions of the leadframe 12, and in particular the die pad 14, tie bars 22 and leads 24 thereof, are covered by an encapsulant material which ultimately hardens into a package body 46 of the semiconductor package 10. When the encapsulant material used to form the package body 46 is initially applied to the leadframe 12, such encapsulant material flows over and covers the side surface of the die pad 14, including the shelf 20 thereof. The encapsulant material also covers the side surfaces of the inner end portions of the leads 24, the shelves 30 defined by the inner end portions 32, and the bottom surfaces of the tie bars 22. The encapsulant material also flows between adjacent pairs of the leads 24, between the leads 24 and the tie bars 22, and between the leads 24 and the die pad 14.

Though the encapsulant material does not cover the top or bottom surfaces 16, 18 of the die pad 14, or the bottom surfaces 28 of the leads 24, it does cover portions of the top surfaces 26 of the leads 24, as well as portions of the top surfaces of the tie bars 22. As such, the fully formed package body 46 defines a bottom surface 48 which extends in generally co-planar relation to the bottom surface 18 of the die pad 14 and the bottom surfaces 28 of the leads 24. The package body 46 also defines a top surface which is not generally planar, but rather has a stepped configuration defining a generally planar inner, first section 54, a generally planar middle, second section 52 which circumvents the first section 54, and a generally planar peripheral or outer third section 50 which circumvents the second section 52. When viewed from the perspective shown in FIGS. 1 and 2, the second section 52 of the top surface of the package body 46 is recessed relative to the third section 50, with the first section 54 in turn being recessed relative to the second section 52. In this regard, the first section 54 of the top surface of the package body 46 extends in generally co-planar relation to the top surface 16 of the die pad 14, the top surfaces 26 of the leads 24, and the top surfaces of the tie bars 22.

As seen in FIGS. 1-3, portions of the top surfaces 26 of the leads 24 and the top surfaces of the tie bars 22 are covered by those portions of the package body 46 which define the second and third sections 52, 50 of the top surface thereof. However, at least those portions of the top surfaces 26 of the leads 24 which define the inner end portions thereof are not covered by the package body 46, but rather are exposed in and substantially flush or coplanar with the first section 54 of the top surface thereof as indicated above. Also exposed in and substantially coplanar with the first section 54 of the top surface of the package body 46 are portions of the top surfaces of the tie bars 22. Advantageously, the flow of the encapsulant material used to form the package body 46 over the shelves 20, 30 creates an effective mechanical interlock between the die pad 14, leads 24 and package body 46.

The semiconductor package 10 further comprises a metal lid 56 which is attached to the package body 46 through the use of conventional assembly methods. As seen in FIGS. 1 and 2, the lid 56 defines a peripheral rim which is attached to the second section 52 of the top surface of the package body 46 through the use of a layer 60 of a non-conductive epoxy or die attach material. The lid 56 thus covers or shields the first and second semiconductor dies 32, 40, as well as the wires 38. Importantly, the loop height of the wire mesh 44 formed on the metalized top surface of the second semiconductor die 40 is sized such that when the lid 56 is attached to the package body 46 through the use of the layer 60, the wire mesh 44 contacts and is actually compressed or compacted by the top interior surface 58 of the lid 56, thereby forming an electrically conductive path between the metal lid 56 and the metalized area on the top surface of the second semiconductor die 40. In this regard, during the placement of the lid 56 upon the package body 46, the wire mesh 44, after making contact with the interior surface 58 of the lid 56, is held in place by natural tension compression created during the assembly process. Further, the curing of the layer 60 secures the wire mesh 44, thus limiting any post assembly movement thereof.

As a result of the electrical connection between the lid 56 and second semiconductor die 40 facilitated by the wire mesh 44, in conjunction with the electrical connection of the metalized area or top surface of the second semiconductor die 40 to the die pad 14 by one of the wires 38, an electrical continuity is established between the lid 56 and the die pad 14. In this regard, in the semiconductor package 10 is designed such that all of the internal package elements associated with the lid 56, the metalized second semiconductor die 40, and the die pad 14 will be at the same electrical potential based on the wiring interconnect design. Along these lines, the wire(s) 38 which are covered by the lid 56 and facilitate the electrical connection of the second semiconductor die 40 to the die pad 14 enhance the effectiveness of the shielding while minimizing or eliminating ground bounce and the effects of ESD reactants. In the semiconductor package 10, the wires of the wire mesh 44 are preferably of the same diameter as the above-described wires 38. However, if long wires are required, it is preferable to use at least 1 mil wire to minimize concerns of excessive wire deflection during the placement of the lid 56. In the semiconductor package 10, the use of the non-conductive layer 60 to attach the lid 56 to the package body 46 is suitable as the lid 56 is "grounded" as a result of its contact with the wire mesh 44. Further, it is estimated that the performance of the shielding facilitated by the above-described structural features thereof will provide, at the very least, effective shielding at high frequencies in the range of 1-2 GHz and 15-100 Hz on the low end.

Figure 4:
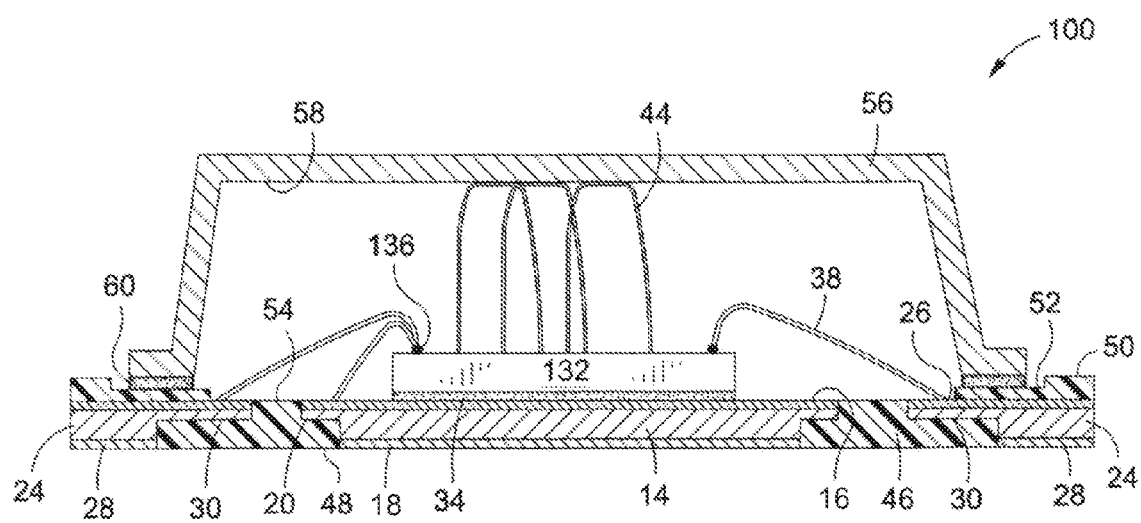
FIG. 4 is a cross-sectional view of a semiconductor package constructed in accordance with a second embodiment the present invention.

Referring now to FIG. 4, there is shown a semiconductor package 100 constructed in accordance with a second embodiment of the present invention. The semiconductor package 100 is substantially similar in structure to the above-described semiconductor package 10, with the sole distinctions lying in the elimination of the above-described second semiconductor die 40 in the semiconductor package 100, and the substitution of the above-described first semiconductor die 32 of the semiconductor package 10 with the semiconductor die 132 in the semiconductor package 100.

In the semiconductor package 100, the semiconductor die 132 is attached to the top surface 16 of the die pad 14. More particularly, the semiconductor die 132 defines opposed, generally planar top and bottom surfaces, with the bottom surface of the semiconductor die 132 being attached to a central portion of the top surface 16 of the die pad 14 through the use of the adhesive layer 34. Disposed on a peripheral portion of the top surface of the first semiconductor die 132 is a plurality of conductive terminals 136, at least some of which are electrically connected to respective ones of the leads 24 through the use of the conductive wires 38. As shown in FIG. 4, it is also contemplated that one or more wires 38 may be used to facilitate the electrical connection of one or more of the terminals 136 to a peripheral portion of the top surface 16 of the die pad 14 to provide a grounding function.

In the semiconductor package 100, at least a portion of the top surface the semiconductor die 132 is metalized, thus defining a metalized area. The metalized area is preferably in a central portion of the top surface, and is sized so as not to interfere with the terminals 136. It is contemplated that the metalized area may be provided on the top surface of the semiconductor die 132 through the use of a redistribution layer (RDL) cap process, or by a large metalized feature designed and exposed during wafer fabrication (e.g., a large bond pad opening or BPO). The metallization formed on the semiconductor die 132 may be Al, NiAu, or any other appropriate material used in the construction of IC packages. As will be recognized, in the semiconductor package 10 of the first embodiment, the metalized area is defined by the separate second semiconductor 40 stacked upon the underlying first semiconductor die 32. Irrespective of how the metalized area is formed on the top surface of the semiconductor die 132, in the semiconductor package 100, the wire mesh 44 is formed on such metalized area, with the loop height of the wire mesh 44 in the semiconductor package 100 being sized such that when the lid 56 is attached to the package body 46 through the use of the layer 60, the wire mesh 44 contacts and is actually compressed or compacted by the top interior surface 58 of the lid 56, thereby forming an electrically conductive path between the metal lid 56 and the metalized area on the top surface of the semiconductor die 132.

An exemplary method of fabricating the semiconductor packages 10, 100 comprises the initial step of providing the leadframe 12 which has the above-described structural attributes, and is partially encapsulated by the package body 46 also having the above-described structural attributes. Thereafter, for the semiconductor package 10, the first and second semiconductor dies 32, 40 are attached to the die pad 14 of the leadframe 12 in the stacked arrangement described above. In the case of the semiconductor package 100, the semiconductor die 132 is attached to the die pad 14 of the leadframe 12 in the aforementioned manner. Thereafter, the first and second semiconductor dies 32, 40 (in the case of the semiconductor package 10) or the semiconductor die 132 (in the case of the semiconductor package 100) are wire bonded to the leads 24 and die pad 14 in the above-described manner through the use of the wires 38.

Upon the completion of the wire bonding process, the wire mesh 44 is formed upon the metalized area on the top surface of the second semiconductor die 40 (in the case of the semiconductor package 10) or on the metalized area on the top surface of the semiconductor die 132 (in the case of the semiconductor package 100). Thereafter, the lid 56 is attached to the package body 46 in the aforementioned manner through the use of the adhesive layer 60, such attachment facilitating the compression or compaction of the wire mesh 44 as described above, and thus facilitating the electrical connection or communication between the lid 56 and the die pad 14.

It is contemplated that the semiconductor packages 10, 100 will be used in conjunction with a PCB which incorporates an electrical circuit between the die pad 14 of the semiconductor package 10, 100 and one or more ground planes within the motherboard design. When the semiconductor package 10, 100 (including the leads 24 and exposed die pad 14) are soldered onto the application PCB motherboard, the device shield is complete, having placed the lid 56, die pad 14, and ground plane within the application board all at the same electrical potential. Though, in the semiconductor packages 10, 100, the leadframe 12 partially encapsulated by the package body 46 is described as defining the underlying substrate for the first and second semiconductor dies 32, 40 (or semiconductor die 132) and the lid 56, those of ordinary skill in the art will recognize that the concept as establishing the electrical connection between the metal lid 56 and a metalized area of a metalized semiconductor die may be extended to other semiconductor package structures, including those wherein the combination of the leadframe 12 and package body 46 are substituted with a different type of substrate. Additionally, it is contemplated that the configuration of the package body 46, tie bars 22 and/or leads 24 may be modified from that described above as allows for the direct electrical connection of the lid 56 to one or more of the tie bars 22 and/or leads 24 through the use of a conductive epoxy or die attach material. In this regard, any such direct electrical connection between the lid 56 and one or more of the tie bars 22 and/or leads 24 would be in addition to the direct electrical connection between the lid 56 and the second semiconductor die 40 or the semiconductor die 132 facilitated by the wire mesh 44. Thus, depending upon the design of the leadframe 12 and the configuration of the package body 46, some of the leads 24 may be at the same electrical potential as the die pad 14 and will supplement the electrical circuit between the first semiconductor die 32 and the PCB or the semiconductor die 132 and the PCB.

This disclosure provides exemplary embodiments of the present invention. The scope of the present invention is not limited by these exemplary embodiments. Numerous variations, whether explicitly provided for by the specification or implied by the specification, such as variations in structure, dimension, type of material and manufacturing process may be implemented by one of skill in the art in view of this disclosure.

What is claimed is:

1. A semiconductor package comprising:
   a semiconductor die having terminals and a metalized surface portion, the metalized surface portion disposed on a major surface of the semiconductor die and spaced apart from the terminals, the semiconductor die coupled to a die paddle, and the metalized surface portion electrically connected to the die paddle;

a wire mesh formed on the metalized surface portion of the semiconductor die;

a plurality of leads extending at least partially about the semiconductor die, wherein the semiconductor die and at least a portion of the plurality of leads are electrically connected;

a package body covering at least portions of the plurality of leads; and a lid having a peripheral rim portion attached to the package body and a top portion, the top portion having a first surface facing the semiconductor die and a second surface opposite to the first surface and external to the semiconductor package, wherein the first surface is spaced apart from the package body, and wherein the wire mesh physically contacts the first surface to provide an electrically conductive path between the lid and the die paddle.

2. The semiconductor package of claim 1 wherein:

the package body includes a bottom surface, and a top surface having at least first and second sections, the first section being recessed relative to the second section;

the lid is attached to the second section of the top surface; and the package body is formed such that at least some of the leads include a portion which is exposed in the first section of the top surface.

3. The semiconductor package of claim 2 wherein those leads which include a portion exposed in the first section of the top surface of the package body each comprise:

a generally planar top surface which is partially exposed in the first section of the top surface of the package body;

a generally planar bottom surface which is disposed in opposed relation to the top surface and exposed in the bottom surface of the package body; and a shelf which is disposed in opposed relation to the top surface and recessed relative to the bottom surface, the shelf being covered by the package body.

4. The semiconductor package of claim 3 wherein the semiconductor die is electrically connected to the partially exposed top surfaces of at least some of the leads through the use of conductive wires which are covered by the lid.

5. The semiconductor package of claim 2 wherein the lid is attached to the second section of the top surface of the package body by a non-conductive epoxy.

6. The semiconductor package of claim 1 wherein the wire mesh is sized to be of a loop height which is selected to facilitate at least a partial compaction of the wire mesh between the semiconductor die and the lid.

7. A semiconductor package comprising:

a die pad;

a semiconductor die attached to the die pad having a plurality of terminals and a metalized surface portion, wherein the metalized surface portion is centrally located on the semiconductor die and spaced apart from the terminals;

a wire mesh formed on the metalized surface portion of the semiconductor die;

a plurality of leads extending at least partially about the die pad in spaced relation thereto, the semiconductor die being electrically connected to at least some of the leads and the metalized surface portion being electrically connected to the die pad;

a package body comprising an encapsulant material covering at least portions of the die pad and the leads; and a lid having a peripheral rim portion attached to the package body and a top portion, the top portion having a first surface facing the semiconductor die and a second surface opposite to the first surface and external to the semiconductor package, wherein the first surface is spaced apart from the package body and physically contacts the wire mesh, and wherein the lid is electrically connected to the die pad through the wire mesh and the metalized surface portion.

8. The semiconductor package of claim 7 wherein:

the package body includes a bottom surface, and a top surface having at least first and second sections, the first section being recessed relative to the second section and disposed between inner ends of the plurality of leads and a side surfaces of the die pad;

the lid is attached to the second section of the top surface; and the package body is formed such that the die pad and at least some of the leads each include a portion which is exposed in the first section of the top surface.

9. The semiconductor package of claim 8 wherein those leads which include a portion exposed in the first section of the top surface of the package body each comprise:

a generally planar top surface which is partially exposed in the first section of the top surface of the package body;

a generally planar bottom surface which is disposed in opposed relation to the top surface and exposed in the bottom surface of the package body; and a shelf which is disposed in opposed relation to the top surface and recessed relative to the bottom surface, the shelf being covered by the package body.

10. The semiconductor package of claim 9 wherein the die pad comprises:

a generally planar top surface which is exposed in the first section of the top surface of the package body;

a generally planar bottom surface which is disposed in opposed relation to the top surface and exposed in the bottom surface of the package body; and a shelf which is disposed in opposed relation to the top surface and recessed relative to the bottom surface, the shelf being covered by the package body.

11. The semiconductor package of claim 10 further comprising a plurality of tie bars which each extend from the die pad and comprise:

a generally planar top surface which is partially exposed in the first section of the top surface of the package body;

a generally planar bottom surface which is disposed in opposed relation to the top surface and is covered by the package body.

12. The semiconductor package of claim 10 wherein the semiconductor die is electrically connected to the top surface of the die pad and to the partially exposed top surfaces of at least some of the leads through the use of conductive wires which are covered by the lid.

13. The semiconductor package of claim 8 wherein the lid is attached to the second section of the top surface of the package body by a non-conductive epoxy.

14. The semiconductor package of claim 7 wherein the wire mesh is sized to be of a loop height which is selected to facilitate at least a partial compaction of the wire mesh between the semiconductor die and the lid.

15. A semiconductor package comprising:

a die pad;

a first semiconductor die attached to the die pad;

a second semiconductor die stacked upon and attached to the first semiconductor die, the second semiconductor die defining a metalized surface portion and being electrically connected to the die pad;

a wire mesh formed on the metalized surface portion of the second semiconductor die;

a plurality of leads extending at least partially about the die pad in spaced relation thereto, the first semiconductor die being electrically connected to at least some of the leads;

a package body covering at least portions of the die pad and the leads, wherein the wire mesh is devoid of the package body; and a lid having a peripheral rim portion attached to the package body and a top portion, the top portion having a first surface facing the second semiconductor die and a second surface opposite to the first surface and external to the semiconductor package, wherein the first surface is spaced apart from the package body and physically contacts at least a portion of the wire mesh, and wherein the lid is electrically connected to the die pad through the wire mesh and the metalized surface portion.

16. The semiconductor package of claim 15 wherein:

the package body includes a bottom surface, and a top surface having at least first and second sections, the first section being recessed relative to the second section;

the lid is attached to the second section of the top surface; and the package body is formed such that the die pad and at least some of the leads each include a portion which is exposed in the first section of the top surface.

17. The semiconductor package of claim 16 wherein:

those leads which include a portion exposed in the first section of the top surface of the package body each comprise a generally planar top surface which is partially exposed in the first section of the top surface of the package body, a generally planar bottom surface which is disposed in opposed relation to the top surface and exposed in the bottom surface of the package body; and the die pad comprises a generally planar top surface which is exposed in the first section of the top surface of the package body, and a generally planar bottom surface which is disposed in opposed relation to the top surface and exposed in the bottom surface of the package body.

18. The semiconductor package of claim 17 wherein the first semiconductor die is electrically connected to the top surface of the die pad and to the partially exposed top surfaces of at least some of the leads, and the second semiconductor die is electrically connected to the top surface of the die pad, through the use of conductive wires which are covered by the lid.

19. The semiconductor package of claim 16 wherein the lid is attached to the second section of the top surface of the package body by a non-conductive epoxy.

20. The semiconductor package of claim 15 wherein the wire mesh is sized to be of a loop height which is selected to facilitate at least a partial compaction of the wire mesh between the second semiconductor die and the lid.

* * * * *